United States Patent [19]

Moriyasu

[11] Patent Number: 5,349,539
[45] Date of Patent: Sep. 20, 1994

[54] BEHAVIORAL MODEL PARAMETER EXTRACTOR

[75] Inventor: Hiro Moriyasu, Portland, Oreg.

[73] Assignee: Zeelan Technology, Inc., Beaverton, Oreg.

[21] Appl. No.: 783,855

[22] Filed: Oct. 28, 1991

[51] Int. Cl.$^5$ .............................................. G06G 7/62
[52] U.S. Cl. ..................... 364/578; 364/489; 364/579; 371/23
[58] Field of Search ............... 364/578, 489, 553, 579, 364/580; 324/158 R; 371/23

[56] References Cited

U.S. PATENT DOCUMENTS

| | | | |
|---|---|---|---|
| 3,937,943 | 2/1976 | Debrunner et al. | 235/183 |
| 4,047,002 | 9/1977 | Sloane et al. | 364/726 |
| 4,168,527 | 9/1979 | Winkler | 364/579 |
| 4,622,647 | 11/1986 | Sagnard et al. | 364/580 |
| 4,658,367 | 4/1987 | Potter | 364/553 |
| 4,713,782 | 12/1987 | Blackham | 364/553 |
| 4,744,084 | 5/1988 | Beck et al. | 364/578 |
| 4,996,659 | 2/1991 | Yamaguchi et al. | 364/579 |
| 5,020,010 | 5/1991 | Ogata et al. | 364/489 |
| 5,043,910 | 8/1991 | Chiba | 364/489 |
| 5,047,971 | 9/1991 | Horwitz | 371/23 |
| 5,175,698 | 12/1992 | Barbanell | 364/553 |

OTHER PUBLICATIONS

Systems Technology Incorporated, *Program CC v. 4 Tutorial and Users Guide,* 1988, pp. 1-31.

Primary Examiner—Jack B. Harvey
Assistant Examiner—Kyle J. Choi
Attorney, Agent, or Firm—Dellett and Walters

[57] ABSTRACT

An electronic circuit parameter extraction system is provided with a pulse signal forcing generator, an interface to a device under test (DUT), a signal digitizer, a timebase to control the digitizing interval, a data processor to extract DUT essential root parameters, a circuit and/or system simulator to generate signals from the extracted parameters, and a display system to view acquired and/or simulated signals, and is able to compare simulated signals with previously acquired signals. The circuit parameter extraction system further allows extraction of realistic behavioral model parameters which may be used as a component library model within a computer aided engineering (CAE) simulator, allowing improved convergence between the results obtained with the CAE simulator and the physical circuit system response being modeled.

13 Claims, 8 Drawing Sheets

BEHAVIORAL MODEL PARAMETER EXTRACTOR

This invention relates to a method and apparatus for modeling circuit behavior.

BACKGROUND OF THE INVENTION

Computer simulations such as SPICE or behavioral modeling analysis require component or device models, with device characterizations performed in both frequency domain and time domain. However, it is well known that a SPICE level model contains such detail that it is impractical to use such a model to simulate complex circuits as it takes too much computer time or memory, or both. Device models may be based on data sheet parameters which can differ from parameters of actual physical components, resulting in inaccurate characterizations.

Characterizations of components, circuits and systems are needed in order to model an electronic design. Several conventional approaches have been taken to characterization. Equipment such as oscilloscopes, LCR bridges, network analyzers, and frequency spectrum analyzers are typically used. Typically, a component's impedance may be characterized or tested at a given frequency, such as with an LCR bridge. Oscilloscope measurements of electrical response with respect to time are utilized in combination with swept frequency sources to obtain a wide range of responses over several decades of frequency. However, while conventional time domain instruments such as oscilloscopes will provide time response parameters such as rise and fall time, delay time, etc., these parameters are not sufficient to describe the system or circuit behavioral characteristics necessary for simulation or mathematical system analysis.

A second approach to characterization using network analyzers to provide frequency information and extracting parameters for simulations can only be applied in the linear region of operation, and therefore cannot simulate non-linear or switching circuits.

Another approach employs predefined models of component behavior, with adjustments made to model parameters until the model response matches the actual device response. While a certain set of parameters may adequately approximate a portion of the actual response, the approach has drawbacks in that a set of parameters providing a good match over one portion of the device response curve may result in a poor match of behavior over other portions of the device response curve. It therefore becomes necessary to determine multiple sets of model parameters to adequately cover an entire response curve.

Electronic circuits, mechanical and electro-mechanical components and physical device characteristics may be described by mathematical expressions such as Laplace transform notation. In such case, the characteristics may be described as a magnitude factor and Laplace domain response parameters such as poles and zeros.

There is the need for a system that will characterize components, circuits and systems and extract the root parameters necessary for modeling, and will confirm the suitability of the model by comparing the results of the model using the extracted parameters and the physical system measurements.

SUMMARY OF THE INVENTION

The present invention is an apparatus and method for extracting electronic device and circuit characteristics over an ultra-wide time range based on direct measurements of the device or circuit response curves rather than parameter estimation through optimization of multiple predefined models over the entire range of device response. The apparatus implementing the present invention comprises a signal source, a means to interface to a device under test, a digitizing system, a means to perform computations in the log(time) domain, a means to compare a circuit model with actual circuit performance, and a means to display the results.

It is therefore an object of the present invention to provide an improved means to analyze time domain characteristics over an ultra-wide time window (picoseconds to seconds, eight or more decades).

Another object of this invention is to provide an improved method and apparatus to characterize a digital circuit's input impedance, output impedance and transfer function in terms of the poles and zeros, since they cannot be characterized by swept frequency measurements.

Yet another object of this invention is to provide an improved method and apparatus for providing stimulus for characterizing electronic devices over a wide time range.

Still another object is to provide an improved means to extract time variations of device parameters such as pole and zero locations.

Yet another object of this invention is to provide an improved means to compare computer simulation with actual test results.

Yet another object of is to provide an improved means for converting one form of a model to another form of model expression by extracting the response from the original model.

A further object of the present invention is to provide an improved means for feedback of the difference between measured and actual device parameters such that the discrepancies between theoretical and actual performance may be resolved.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings.

DETAILED DESCRIPTION

Figure 1:
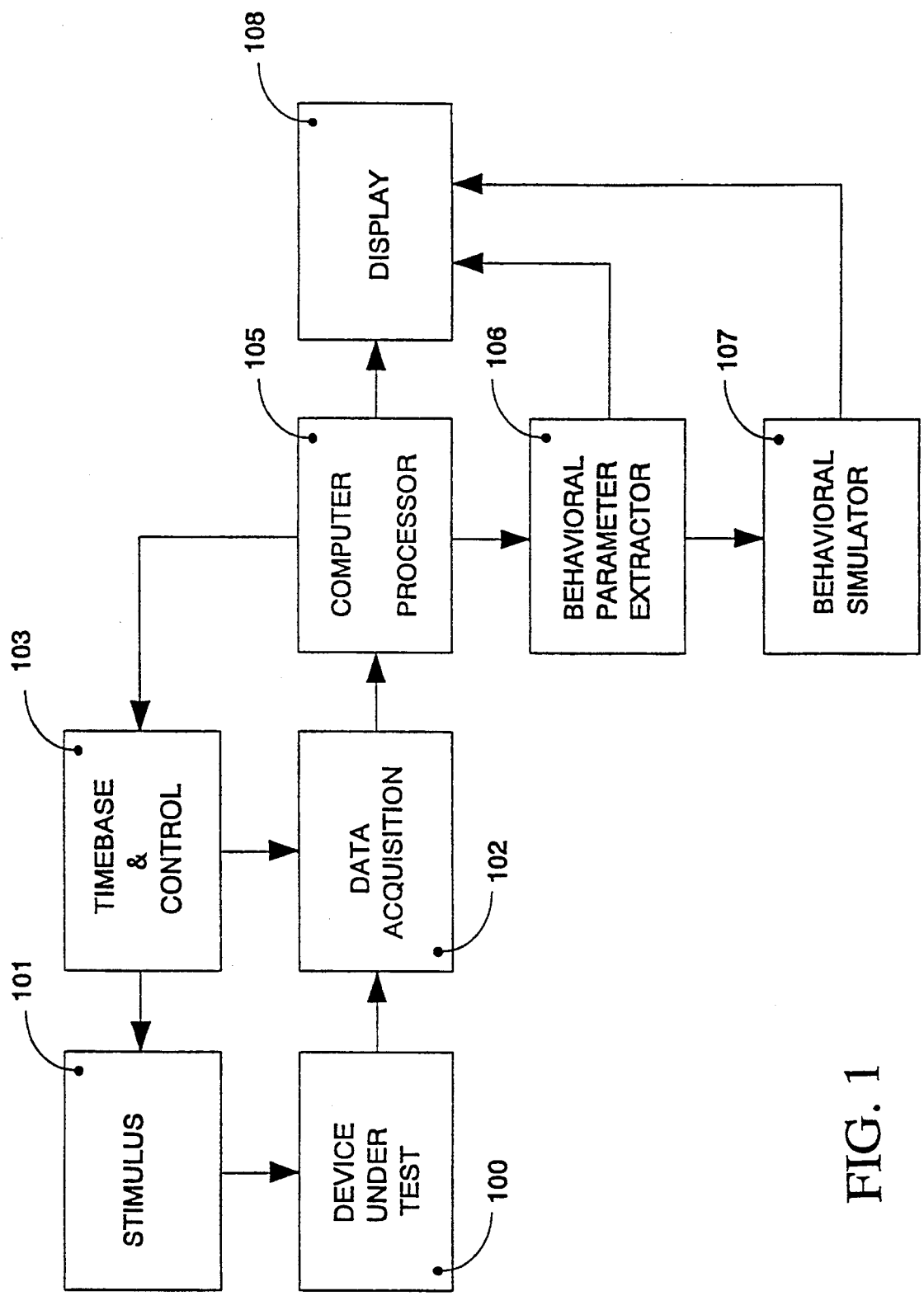
FIG. 1 is a generalized block diagram of the behavioral model parameter extraction system.

Referring now to FIG. 1, a generalized block diagram of the behavioral model parameter extraction system, a device under test 100 (DUT) receives a signal from variable stimulus signal source 101 for providing stimulus thereto in order to elicit a response signal from the DUT. The device under test is also connected to data acquisition block 102 which conditions, digitizes and stores response signal data generated by the device under test. A timebase and control block 103 interfaces with stimulus block 101 and data acquisition block 102 to select stimulus signal variations and conditioning, as well as governing the timing interval for stimulus signal generation and response signal capture by the data acquisition block. A computer processor 105 receives acquired data from block 102 and performs data processing on said acquired data. Processor 105 also interfaces with timebase and control block 103, for providing commands to direct the operation of the timebase and control block, and with display 108, enabling display of the acquired data from the device under test. A behavioral parameter extractor 106 couples to processor 105 and serves to extract the transfer function and input/output characteristics of the device under test in terms of poles and zeros or a ratio of polynomials in Laplace notation, including non-linear effects. The behavioral parameter extractor provides input to behavioral simulator 107 and display 108. The behavioral simulator synthesizes the output response of the device under test based upon the behavior parameters extracted by parameter extractor 106, providing the synthesized output to display 108 to enable viewing of the digitized response of the device under test in conjunction with the synthesized response generated by behavioral simulator 107, thereby enabling comparison of behavior of the actual device with the behavior of the extracted model parameters.

Figure 2:
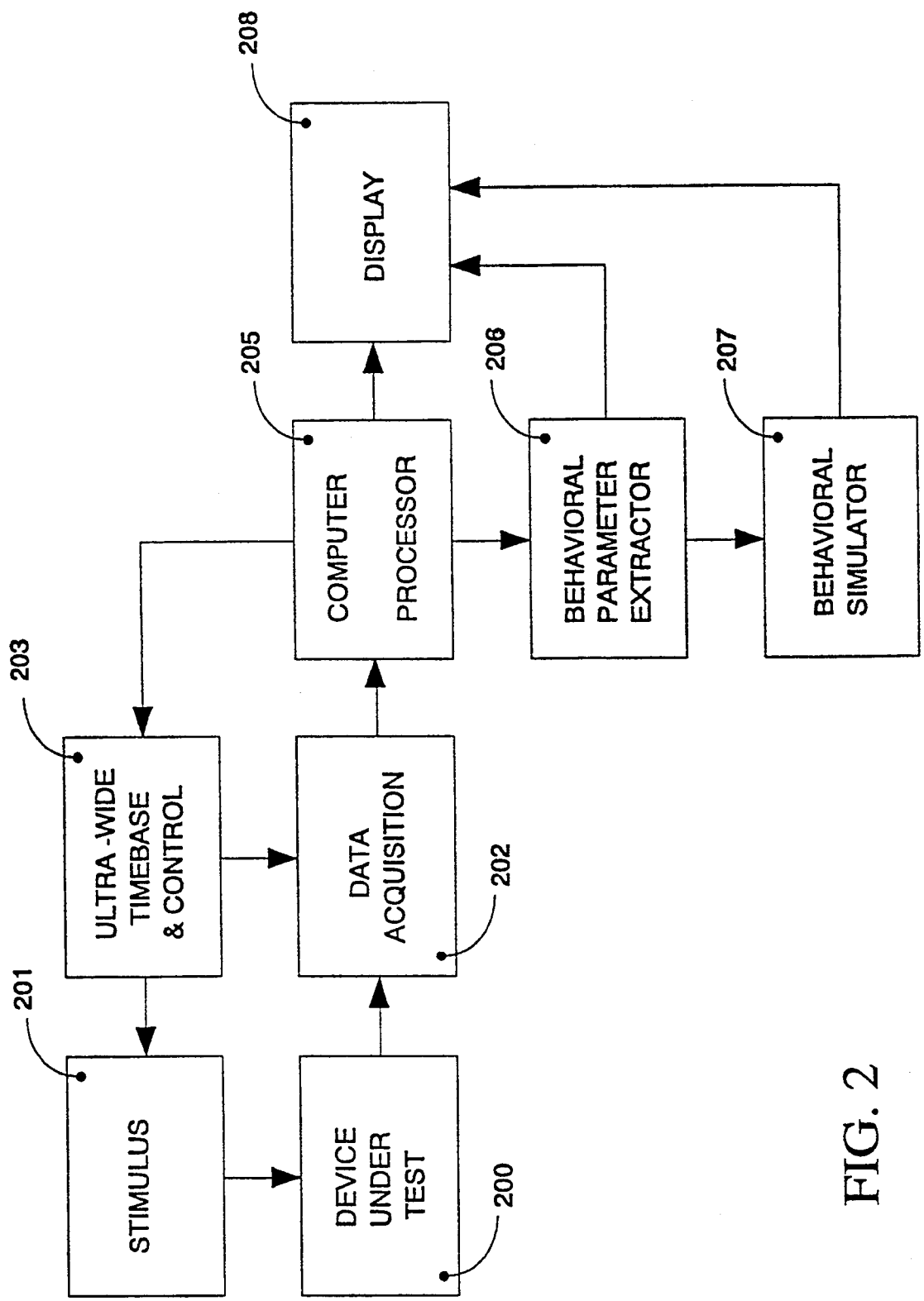
FIG. 2 is a block diagram of the ultra-wide range (picoseconds to seconds) behavioral model extraction system according to the present invention.

FIG. 2 is a block diagram of an ultra-wide range (picoseconds to seconds) behavioral model extraction system according to another embodiment of the present invention. In this embodiment, device under test 200 receives stimulus from stimulus generator 201 and generates output response which is provided to data acquisition block 202. Both stimulus block 201 and data acquisition block 202 receive input from ultra-wide range timebase and control block 203 to select stimulus signal variations and conditioning and to direct the timing interval for stimulus signal generation and response signal capture by the data acquisition block. The ultra-wide range timebase is capable of logarithmic or other non-linear time interval generation over multiple decades of time as described in co-pending U.S. patent application Ser. No. 07/621,620, filed Dec. 3, 1990 (Moriyasu). The ultra-wide timebase typically employs a fast time interval when the DUT response is expected to be changing rapidly and then slows down the time interval when the DUT response is changing slowly. As such, the amount of data required to represent the DUT response is greatly compressed, and yet the behavioral parameters of the DUT may be extracted. While the details of an ultra-wide range timebase are not the subject of this invention, its use in the invention allows for extraction of poles and zeros that may be many decades apart, while requiring a minimum of computation in order to extract accurate locations of the said poles and zeros.

Figure 3:
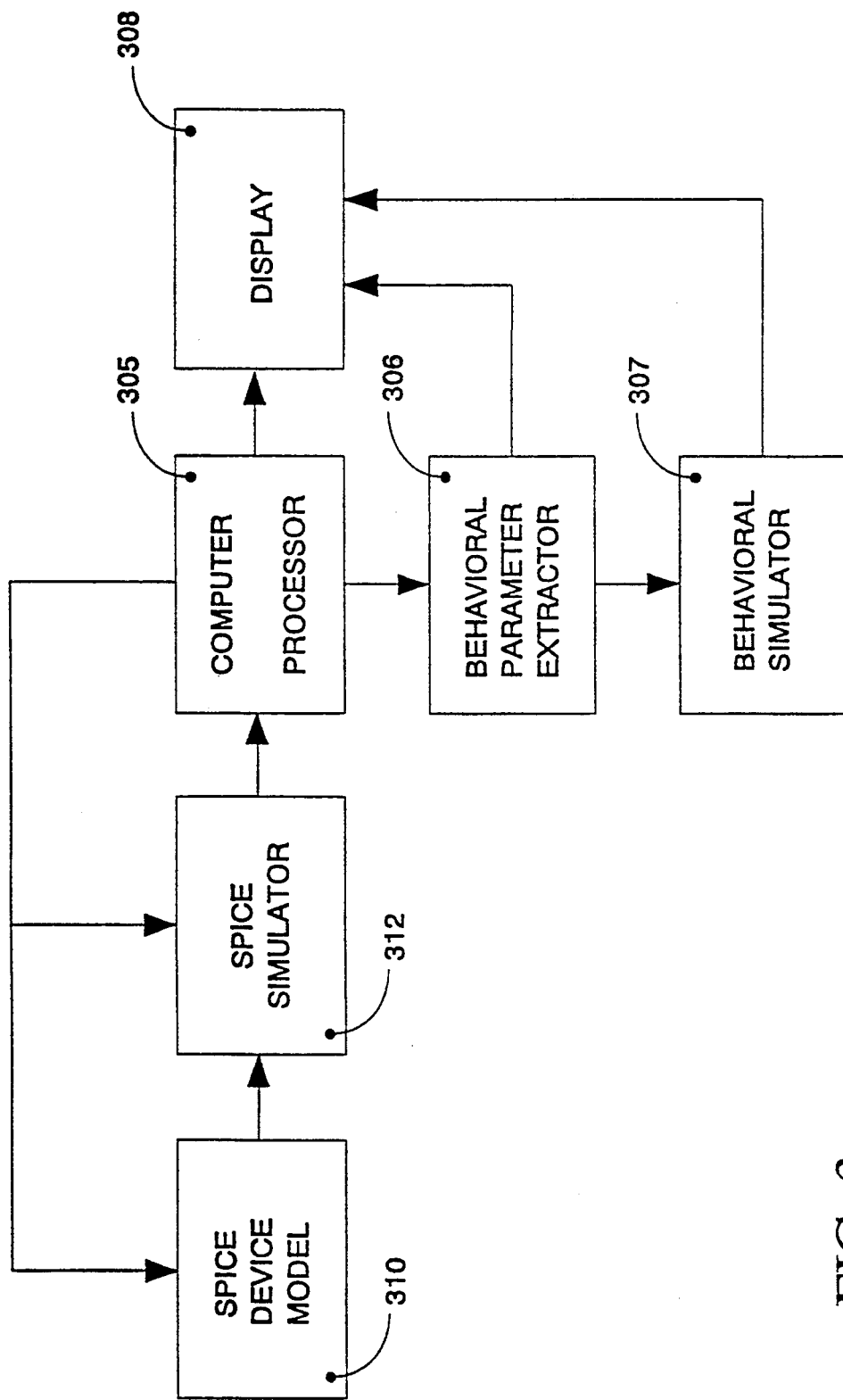
FIG. 3 is a block diagram of a behavioral model extraction system allowing the conversion of a detailed SPICE model to a higher level behavioral model.

FIG. 3 is a block diagram of another embodiment of the invention capable of converting a detailed SPICE based model to a higher level behavioral model. In this embodiment, the physical device under test, the stimulus, data acquisition and timebase control blocks are replaced by a SPICE model 310 of the device under test and SPICE simulator 312. Output from the SPICE model is provided to SPICE simulator 312 and computer processor 305 receives output data from the simulator. The computer provides input to both the simulator and SPICE model such that the SPICE device model and simulator will provide output to the computer processor, modeling a physical device. The computer processor captures and stores the data from the SPICE simulator and this SPICE output data is then furnished to behavioral parameter extractor 306 which extracts the transfer function and input/output characteristics of the SPICE model of the device under test in terms of poles and zeros or as a ratio of polynomials in Laplace notation. As with the systems described with reference to FIG. 1 and FIG. 2 hereinabove, both the computer processor and the behavioral parameter extractor provide input to display 308, for display of the output response of the SPICE model. Behavioral simulator 307 receives parameter information from extractor 306 and generates simulated response data, provided to display 308. In this manner, the original SPICE model response and the behavioral simulator response may be displayed and compared. The degree of complexity of the behavioral model (the number of poles and zeros, as well as the number of non-linear coefficients) can then be chosen to best match the required accuracy and computation time desired.

Figure 4:
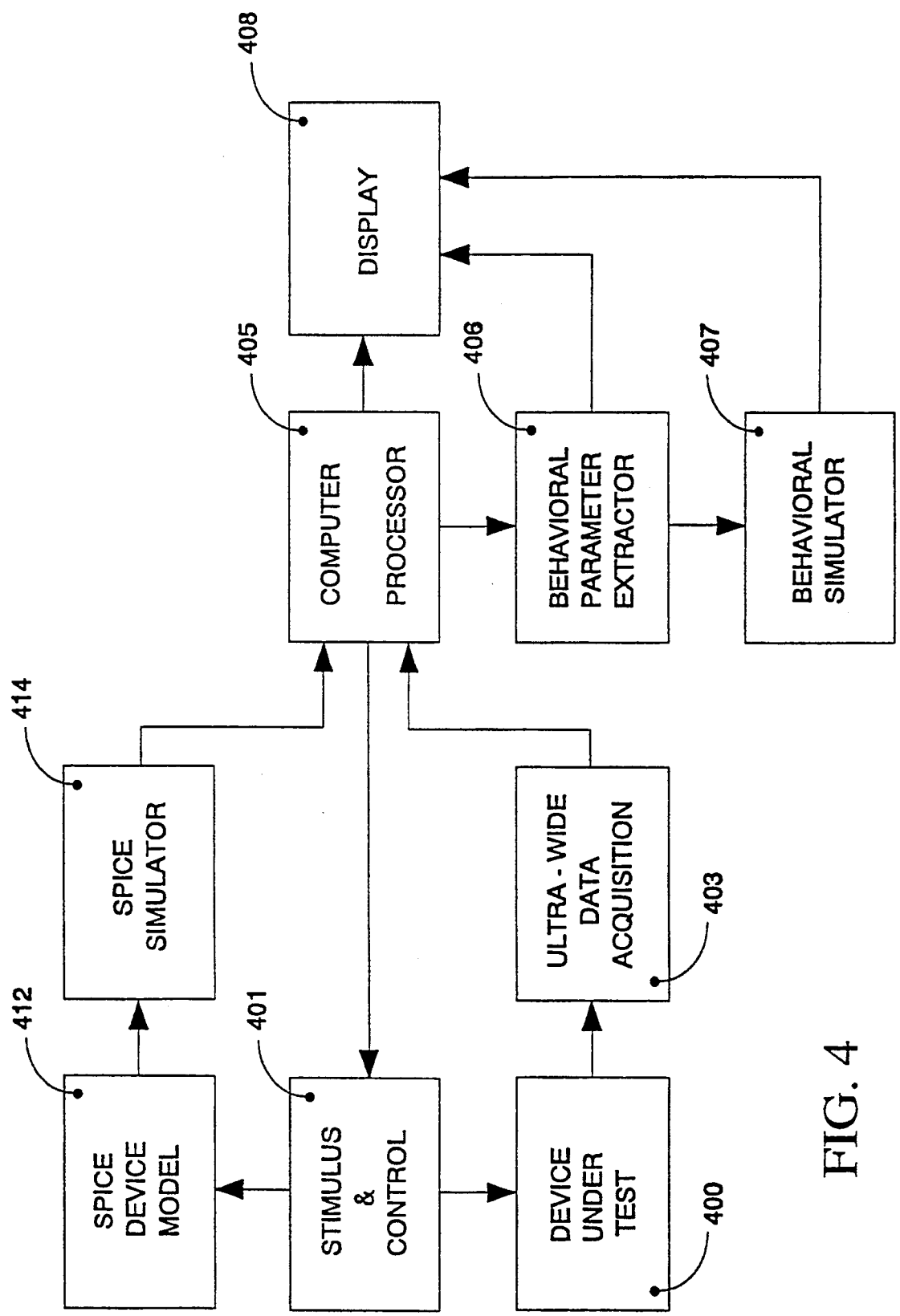
FIG. 4 is a block diagram of the behavioral model extraction system allowing model extraction from both a physical system and a SPICE model and comparison between the physical system, the extracted behavioral model from the physical system, the SPICE model, and the behavioral model extracted from the SPICE model, to allow reconciliation of differences.

FIG. 4 is a block diagram of another embodiment of the invention wherein the system will extract the behavioral parameters in Laplace notation (or poles and zeros) from either a physical device under test 400 or a SPICE model 412 of the same physical device. The device under test receives stimulus and control information from stimulus and control block 401, providing output to ultra-wide data acquisition block 403. Data acquisition block 403 supplies output data to computer processor 405 for processing. The processor sends control information to stimulus and control block 401. The stimulus block is also interconnected with the SPICE device model block 412, which communicates with SPICE simulator 414 and information therefrom is supplied to computer 405. As with the other embodiments described herein, computer 405 interfaces with display 408 and behavioral parameter extractor 406, sending either DUT response data or SPICE model response data for parameter extraction. The extractor provides the parameters to behavioral simulator 407, and both extractor 406 and simulator 407 send display data to display 408. This system allows the resolution of differences between the physically observed responses and those responses synthesized from a detailed SPICE model, as well as the behavioral models generated by the behavioral parameter extractor 406. The behavioral models may be generated from either the SPICE model or the physical device or both.

It is well known that a SPICE level model contains such detail that it is impractical to use it to simulate complex circuits as it takes too much computer time and/or memory. Thus a higher level model such as a behavior model is advantageous for simulating complex circuits. Further, behavioral model parameters extracted in accordance with the present invention may be employed as component library models within a computer aided engineering simulator, resulting in simulation results which more closely represent the behavior of the physical circuit.

The behavioral model parameter extractor described herein also allows the characterization of a device under test that is operating in a non-linear mode or has asymmetric characteristics. For example, device under test parameters can be extracted for a positive transition input pulse and a negative transition input pulse. Electronic switching circuits often exhibit such characteristics, for example, transistor switching circuits have different transition speeds turning on versus turning off. Non-linear device parameters can be extracted for the different conditions and the parameters for the model expressed in the model by describing the parameters for different conditions.

The generalized Laplace notation for a system is shown in equation (1):

$$V_{out}(s) = V_{in}(s) \cdot H(s) \quad (1)$$

In equation (1), the output signal $V_{out}(s)$ is equal to the input signal $V_{in}(s)$ times the transfer function $H(s)$. The transfer function $H(s)$ can be generalized as a ratio of polynomials with numerator roots $z_1, z_2, z_3, \ldots z_n$, called zeros, and denominator roots $P_1, P_2, P_3, \ldots P_{n+1}$, called poles, as shown in equation (2).

$$H(s) = \frac{(s + z_1)(s + z_2)(s + z_3)\ldots(s + z_n)}{(s + p_1)(s + p_2)(s + p_3)\ldots(s + p_{n+1})} \quad (2)$$

Since both polynomials must be real, then the roots are either real or complex conjugate pairs. In order for a system to be physically realizable, there must be at least one more pole than there are zeros.

Equation (2) can be normalized as shown in (3), where $A_v$, the normalization constant, is called the gain if it is larger than 1 or the attenuation, if is smaller than 1.

$$H(s) = A_v \frac{(s\tau_{z1} + 1)(s\tau_{z2} + 1)(s\tau_{z3} + 1)\ldots(s\tau_{zn} + 1)}{(s\tau_{p1} + 1)(s\tau_{p2} + 1)(s\tau_{p3} + 1)\ldots(s\tau_{pn+1} + 1)} \quad (3)$$

where $\tau_{zi} = \frac{1}{z_i}$ and, $\quad (4)$ $$\tau_{pi} = \frac{1}{p_i} \quad (5)$$

As an example, considering a system having one pole and no zeros, equation (3) reduces to $$H(s) = A_v \frac{1}{(s\tau_{p1} + 1)} \quad (6)$$

In a linear system, $A_v$ and $t_{p1}$ are constant, and Laplace transform tables give a response $V_{out}(t)$ to a unit step as:

$$V_{out}(t) = A_v e^{-t_{p1}} \text{ or } A_v(1 - e^{-t_{p1}}) \quad (7), (8)$$

which is characterized by an exponentially decaying or rising waveform.

A model for a response characterized by unequal rise and fall times can be described as shown in (9), (10) and (11):

$$H(s) = A_v \frac{1}{(s\tau_{p1} + 1)} \quad (9)$$

where $A_v = A_1, \tau_{p1} = \tau_1$ for $\frac{dV_{in}(t)}{dt} \geq 0 \quad (10)$ and $A_v = A_2, \tau_{p1} = \tau_2$ for $\frac{dV_{in}(t)}{dt} < 0 \quad (11)$ Thus, in a more complex system, $A_v$ can be represented, for example, by a polynomial function of the input voltage $V_{in}$. Using an even more complex model, a number of the pole and zero locations can be represented by an nth order polynomial function of one or more variables.

It should be noted that while Laplace transforms are only valid for linear systems, Laplace notation as shown above can be used to model nonlinear response. Contemporary computer behavioral simulators can work with such notation as well as other non-linear and discrete functions.

There are many methods of extracting the pole and zero location from the data retrieved from the DUT. In one embodiment, the information acquired by the data acquisition circuitry is differentiated and the Fourier transform of the differentiated data is computed. The Fourier transform of the first derivative of the step response is, by definition, the transfer function. Next, the magnitude of the transfer function is computed and this data is then least square fitted with an nth order polynomial. The roots of this polynomial are then calculated and represent the extracted poles and zeros.

Figure 5:
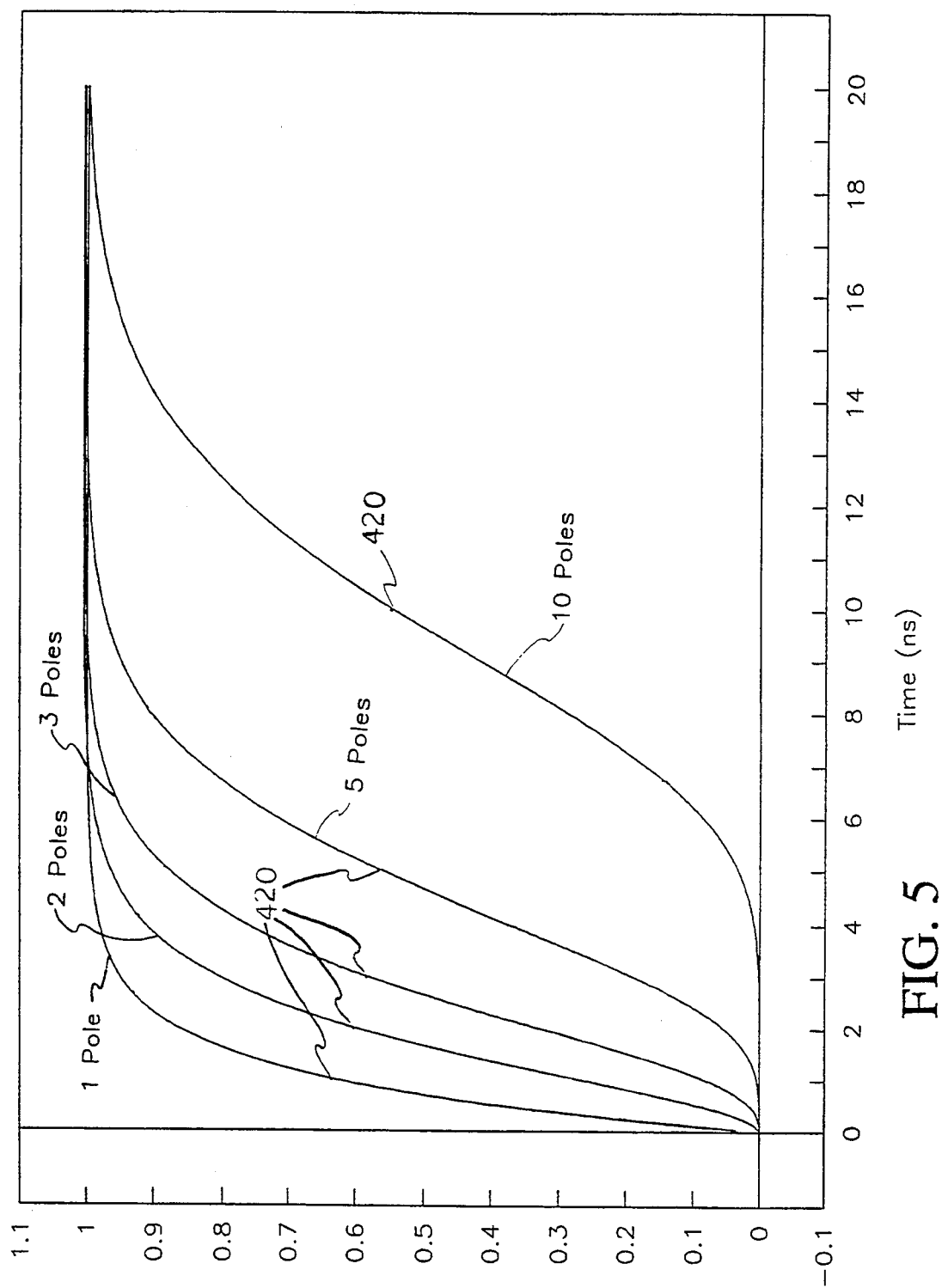
FIG. 5 is a graph illustrating the step response of a circuit having n poles.
Figure 6:
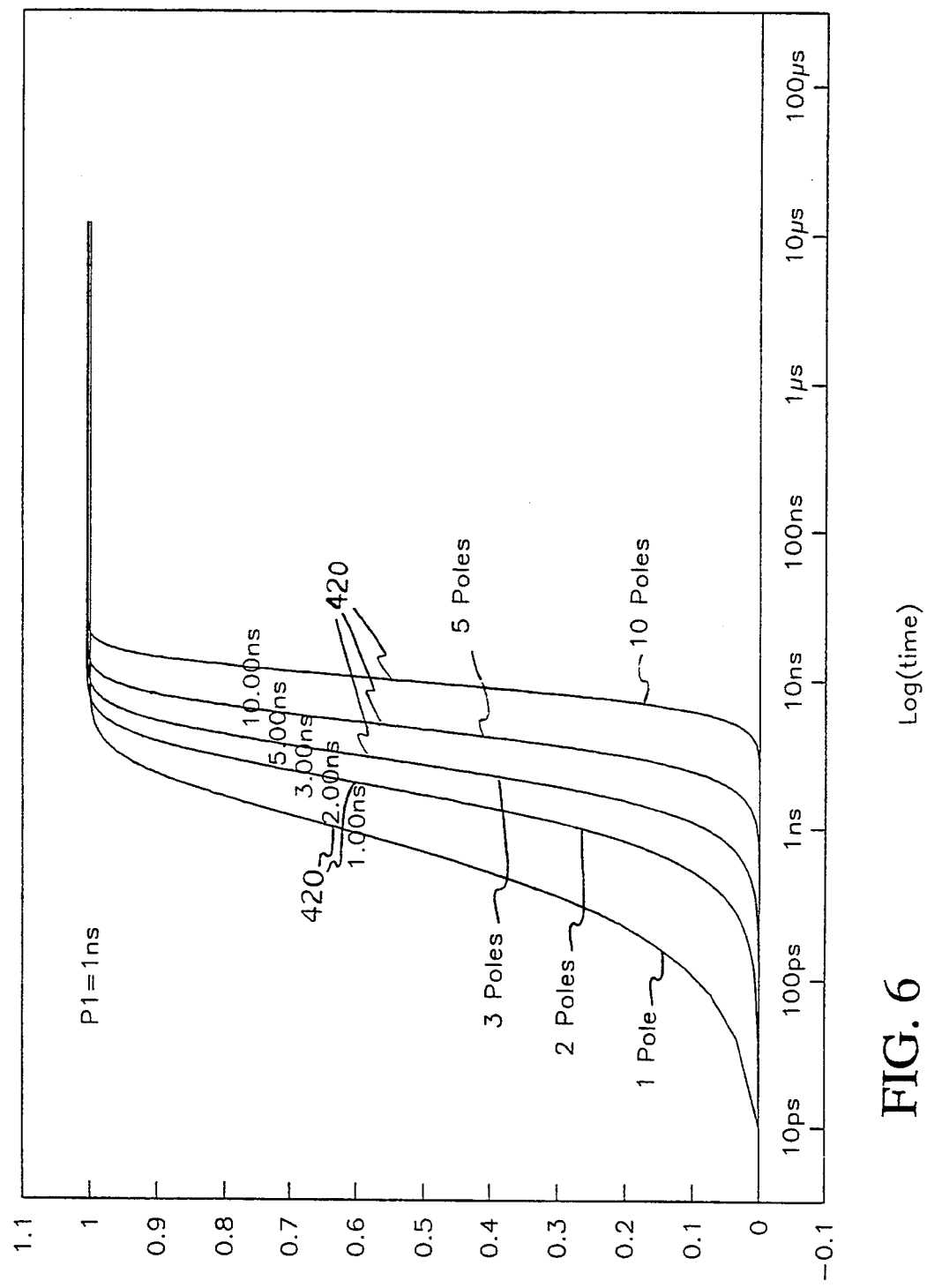
FIG. 6 is a graph illustrating the step response of FIG. 5 displayed using the ultra-wide range timebase.

The use of an ultra-wide range timebase in accordance with FIG. 2 enables the extraction of poles and zeros over a wide dynamic range. It also allows a simple, direct extraction of dominant real poles by differentiating the impulse response with respect to the logarithmic time base. The points at which the slope of the impulse response is zero, correspond with the location of the dominant poles as shown in conjunction with FIGS. 5 through 8. The normalized step response for a circuit with n identical poles $$V_{out}(s) = \frac{1}{s(1 + sT)^n} \quad (12)$$

is illustrated in FIG. 5 on a linear time scale and in FIG. 6 on an ultra-wide range time scale, for the cases of one pole, two poles, three poles, five poles and ten poles.

The first derivative of the step response of (12) is defined by the transfer function $H(s)$ and the impulse response $h(t)$ $$H(s) = \frac{1}{(1 + sT)^n} \quad (13)$$

and $$h(t) = \frac{1}{T^n(n-1)!} t^{n-1} e^{-t/T} \quad (14)$$

Figure 7:
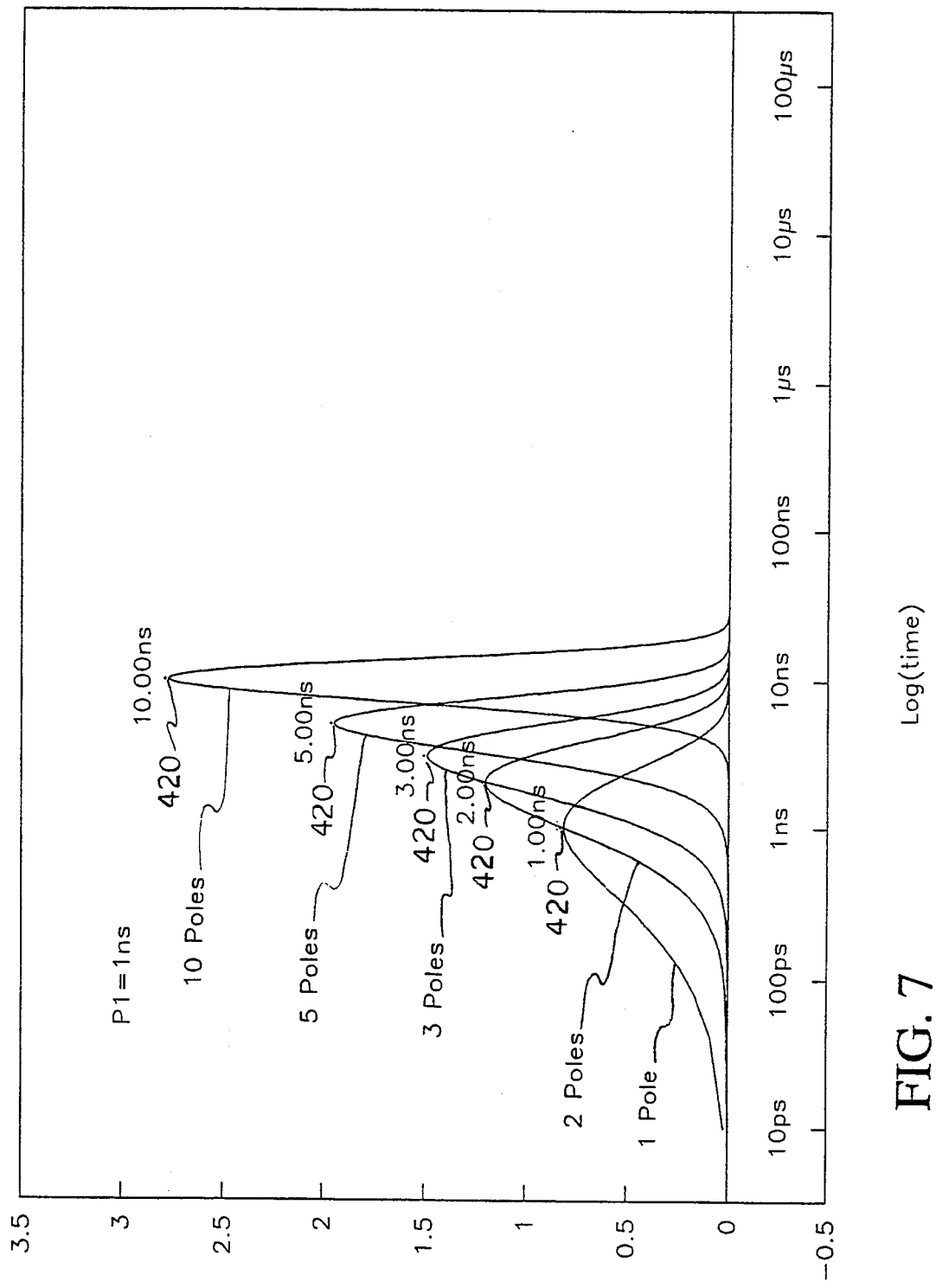
FIG. 7 is a graph illustrating the derivative of the step response of FIG. 6 with reference to the ultra-wide range timebase.

The derivative of a function f(t) with respect to log(t) can be expressed as $$\frac{df(t)}{d\log(t)} = \frac{df(t)}{dt} \frac{dt}{d\log(t)} = t\frac{df(t)}{dt} \quad (15)$$

substituting $f(z) = t \cdot f(t)$ the derivative with respect to log(t) is $$h(z) = \frac{1}{T^n(n-1)!} z^n e^{-z/T} \quad (16)$$

illustrated by the graph of FIG. 7 with reference to the ultra-wide range timebase.

Figure 8:
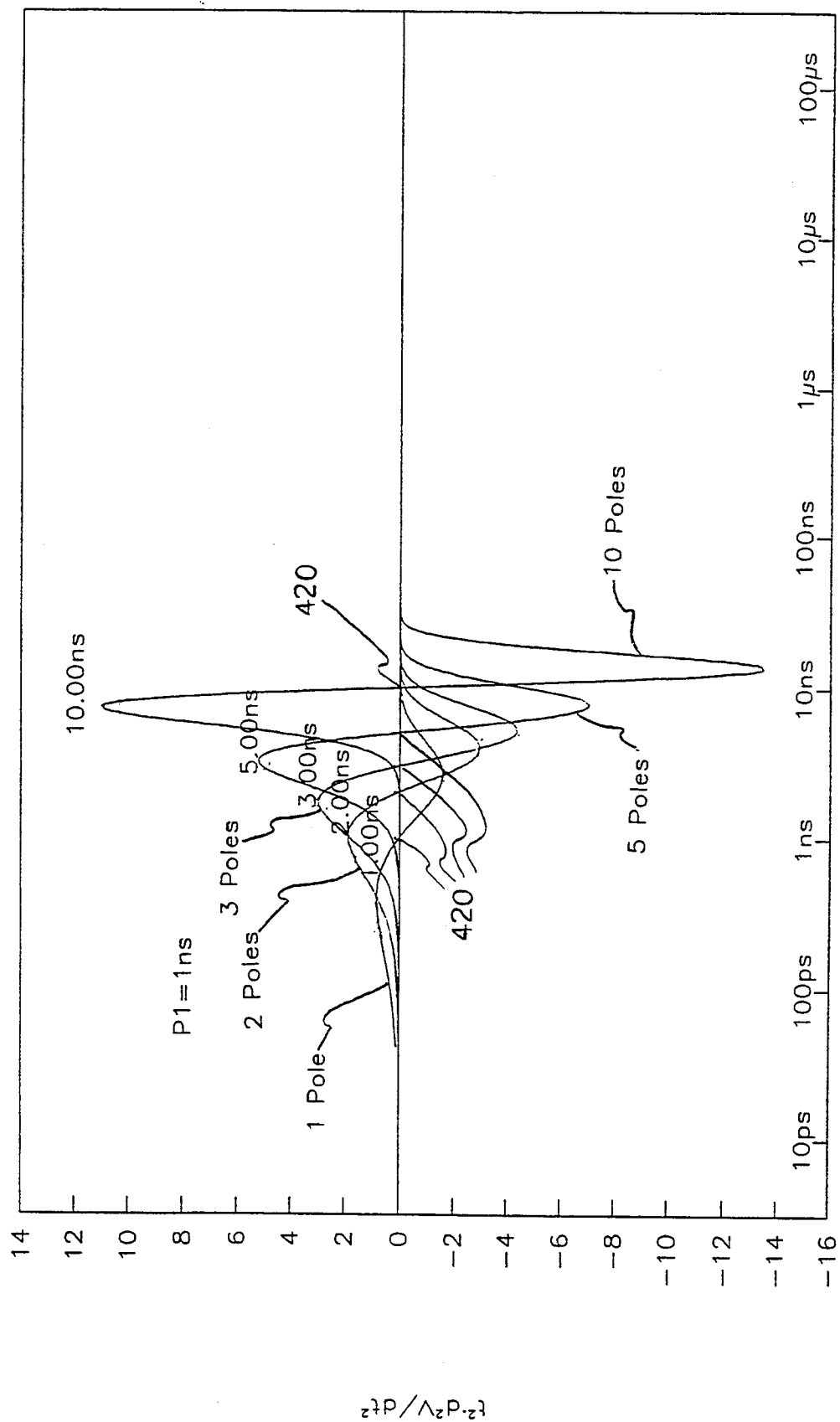
FIG. 8 is a graph illustrating the second derivative of the step response of FIG. 6 with reference to the ultra-wide range timebase.

The first derivative of (16) with respect to z (the second derivative of the step response of FIG. 6) as shown in FIG. 8 is $$\frac{dh(z)}{dz} = \frac{z}{T^n(n-1)!} [nz^{n-1} e^{-z/T} - (z^n/T) e^{-z/T}] \quad (17)$$

Collecting like terms of equation (17) we obtain $$\frac{dh(z)}{dz} = \frac{z}{T^n(n-1)!} [n - (z/T)] z^n e^{-z/T} \quad (18)$$

The roots of this equation are as follows:

$$\frac{dh(z)}{dz} = 0$$

$$z^n = 0 \quad z = 0 \quad (19)$$

$$e^{-z/T} = 0 \quad z = \infty \quad (20)$$

$$[n - z/T] = 0 \quad z = nT \quad (21)$$

The zero crossing occurs at t = nT. The value of the impulse response at the zero crossing is given by $$h(nT) = \frac{1}{(n-1)!} n^n e^{-n} \quad (22)$$

and is dependent only on the number of poles, n. In FIGS. 5-8, the maximum of the first derivative is indicated at 420.

Thus it is seen that extraction of dominant real poles is accomplished by differentiating the impulse response with respect to the logarithmic time base and determining the points at which the slope of the impulse response is zero.

Circuit modeling and analysis is well developed and generally known to the participants in the electronics field; it is beyond the scope of this illustration to show numerous examples.

Behavioral model circuit parameter extraction in accordance with the present invention allows modeling of circuit time response. In practice, since circuit simulations and actual device responses are often not the same, both simulation response and actual test results are displayed in the domain along with their differences, in order to resolve the differences. The differences can be further analyzed to reveal additional pole and zero characteristics of the circuit. Through repeated iterations of modifying the model and comparing simulation results to actual test data, the model can be improved until results match.

The advantage that behavioral model parameter extraction offers is the display and analysis of device and system characteristics and extraction of circuit time and/or frequency dependent parameters. Characterization in the time domain can be transformed to the frequency domain and vice-versa. However, digital devices can only be characterized using time domain signals and cannot be characterized using conventional swept frequency apparatus.

While the examples herein have referred to the transfer function, it will be appreciated that the usage of $V_{in}(t)$ and $I_{in}(t)$ instead of $V_{in}(t)$ and $V_{out}(t)$, thereby characterizing the input impedance, or $V_{out}(t)$ and $I_{out}(t)$, thereby characterizing the output impedance, are included within the scope of this invention.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. Apparatus for extracting circuit and system time domain behavioral model parameters of a device under test in a Laplace notation form comprising:
   pulse stimulus means adapted to interface with the device under test and provide an input stimulus thereto;
   data acquisition means to measure both the input stimulus and response of the device under test;
   timebase means to control the relationship of input stimulus start and stop and data acquisition interval;
   computer processor means to perform data processing of acquired data;
   root parameter extraction means to analyze the acquired data in the time domain with respect to input stimulus and extract critical system and behavioral root parameters, including nonlinear parameters; and
   means to convey information regarding original device under test response and extracted behavioral root parameters.

2. Apparatus according to claim 1 wherein said timebase means comprises an ultra-wide range timebase means to acquire the stimulus and the response of the device under test in an ultra-wide time range.

3. Apparatus according to claim 1 further comprising means to synthesize behavioral model response from the extracted behavioral root parameters for comparison with the original device under test response.

4. Apparatus according to claim 3 wherein said timebase means comprises an ultra-wide range timebase means to acquire the stimulus and the response of the device under test in an ultra-wide time range.

5. Apparatus for extracting behavioral model parameters from a device model comprising:
   means to input a device model;
   simulator means to model the desired response;
   computer processor means to perform data processing of the model response;
   root parameter extraction means to further analyze the model response in the time domain with respect to input stimulus and analyze and extract critical system and behavioral root parameters including nonlinear parameters; and means to present model response and extracted root parameters.

6. Apparatus according to claim 5 further comprising behavioral simulator means for generating a simulated response from the extracted root parameters, and wherein said presenting means also presents the simulated response to enable comparison of the original model response, the extracted root parameters and the simulated response.

7. Apparatus according to claim 6 further comprising:

pulse stimulus means for stimulating a device under test;

data acquisition means to measure device under test response; and timebase means to control the relationship of stimulus start and stop and data acquisition interval, wherein said behavioral parameter extractor means and said behavioral simulator are capable of operating on the device under test response for extracting parameters and simulating behavior thereof.

8. A method of modeling behavior of a device comprising the steps of:

providing a stimulus to the device;

measuring the response of the device;

determining circuit parameters in the time domain based on the response of the device;

displaying the time response of the device; and simulating the response of the device based upon the determined circuit parameters.

9. The method according to claim 8 further comprising the step of displaying the simulated circuit response.

10. A method of modeling behavior of a device comprising the steps of:

providing a stimulus to the device;

measuring the response of the device;

determining circuit parameters in the time domain based on the response of the device; and displaying the time response of the device, wherein said step of determining circuit parameters further comprises determining circuit parameters in Laplace notation form.

11. The method according to claim 10 wherein said step of determining circuit parameters further comprises determining non-linear effects parameters in terms of a polynomial function in place of a constant term in the Laplace notation.

12. The method according to claim 10 wherein said step of determining circuit parameters further comprises selecting the complexity of the expression of the circuit parameters in terms of the order of a polynomial.

13. Apparatus according to claim 1 wherein said pulse stimulus means provides at least one positive transition pulse and at least one negative transition pulse.

* * * * *